(12) United States Patent
Satou (10) Patent No.: US 6,514,089 B2
(45) Date of Patent: Feb. 4, 2003

(54) TERMINAL CONNECTING DEVICE FOR FLEXIBLE SUBSTRATE

(75) Inventor: Kunihiro Satou, Fukuyama (JP)

(73) Assignee: Sharp Kabushiki Kaisha, Osaka (JP)

(*) Notice: Subject to any disclaimer, the term of this patent is extended or adjusted under 35 U.S.C. 154(b) by 16 days.

(21) Appl. No.: 09/840,028

(22) Filed: Apr. 24, 2001

(65) Prior Publication Data

US 2001/0041464 A1 Nov. 15, 2001

(30) Foreign Application Priority Data

May 10, 2000 (JP) ......................................... 2000-137715

(51) Int. Cl.⁷ ............................................. H01R 12/00
(52) U.S. Cl. ........................................... 439/67; 439/493
(58) Field of Search ............................. 439/66, 67, 77, 439/493, 496

(56) References Cited

U.S. PATENT DOCUMENTS 5,730,619 A    3/1998  Hamlin
6,328,577 B1 * 12/2001  Azuma ........................ 439/83

FOREIGN PATENT DOCUMENTS

EP    0 509 380 A2    10/1992
JP    9-22760 A       1/1997
WO    98/00884        1/1998

* cited by examiner

Primary Examiner—Kheim Nguyen
(74) Attorney, Agent, or Firm—Nixon & Vanderhye P.C.

(57) ABSTRACT

A flexible substrate is attached to a terminal connecting device by inserting hold pins of the terminal connecting device to associated holes of the flexible substrate. The terminal connecting device is attached to recesses of an external substrate by means of hold body sections, and concurrently, the signal input/output terminals of the flexible substrate are connected to those of the external substrate. The terminal connecting device is provided with resin springs acting as springs for pressing the signal input/output terminals of the flexible substrate to those of the external substrate to ensure that the signal input/output terminals of the flexible substrate are pressed to those of the external substrate to establish connections between these signal input/output terminals. With this arrangement, a terminal connecting device for a flexible substrate can be offered which allows for readily establishing connection between the external substrate and the flexible substrate. Further, the elimination of connectors allows for reduction in size and weight of the external substrate and reduction in manufacturing cost.

10 Claims, 6 Drawing Sheets

TERMINAL CONNECTING DEVICE FOR FLEXIBLE SUBSTRATE

FIELD OF THE INVENTION

The present invention relates to terminal connecting devices for readily and securely connecting signal input/output terminals of a flexible substrate to those of an external substrate.

BACKGROUND OF THE INVENTION

Large numbers of electronic components are incorporated in portable telephones, video cameras, and other electronic devices which are recently becoming increasingly smaller and lighter. Most components are mounted on substrates. To provide inter-substrate passage for electrical signals, flexible substrates are mostly used because of their light weight and versatility to form complex wiring. The following is some conventional methods to connect a flexible substrate to an external substrate:

(1) The flexible substrate has, either on its end or internally, signal input/output terminals which are secured to those of an external substrate by soldering.

Figure 5:
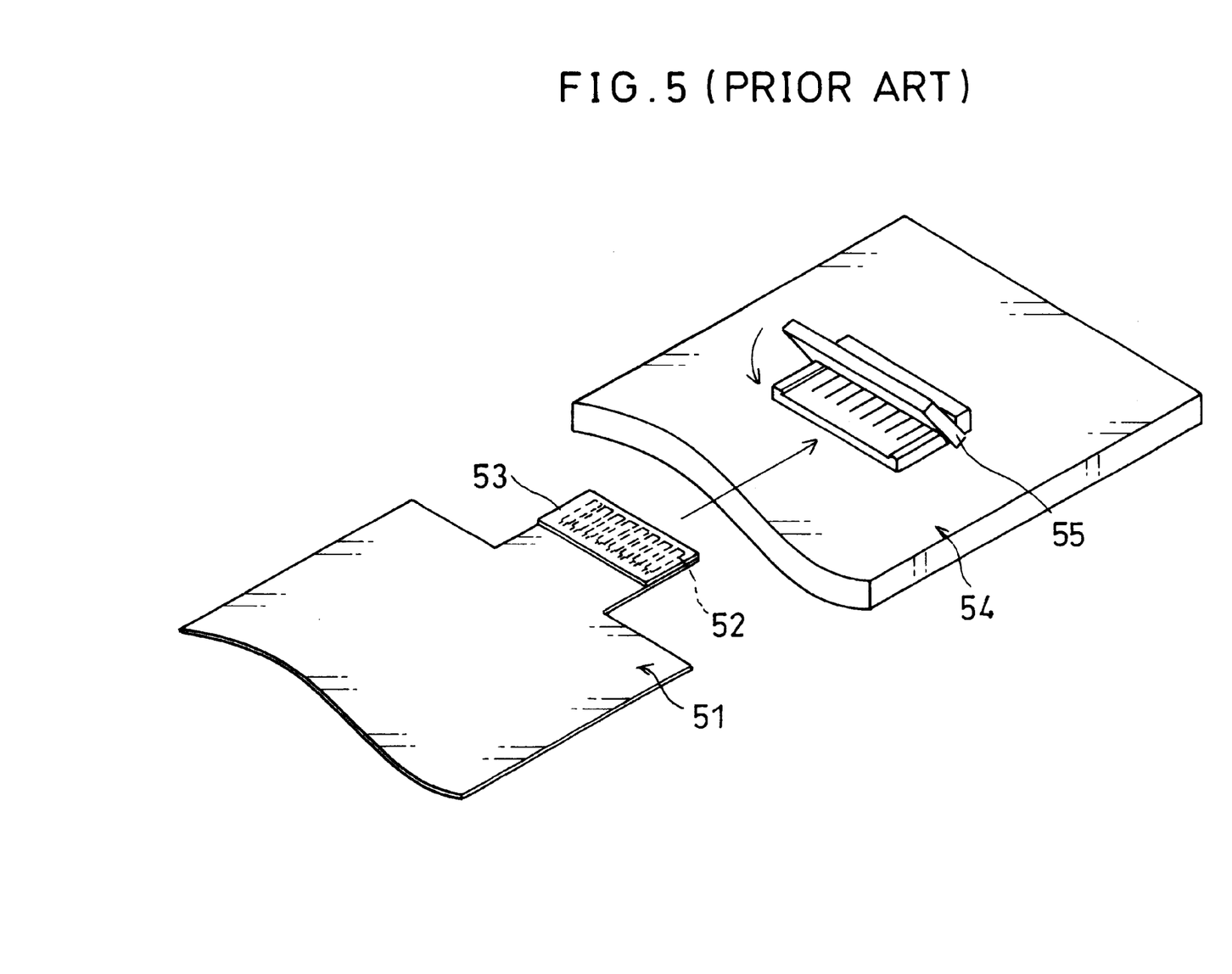
FIG. 5 is a perspective view showing a structure that connects a conventional flexible substrate to an external substrate.

(2) Signal input/output terminals 52 are provided at an end of a flexible substrate 51 as shown in FIG. 5. The terminals 52 are inserted and thus secured to a connector 55 on an external substrate 54.

Figure 6:
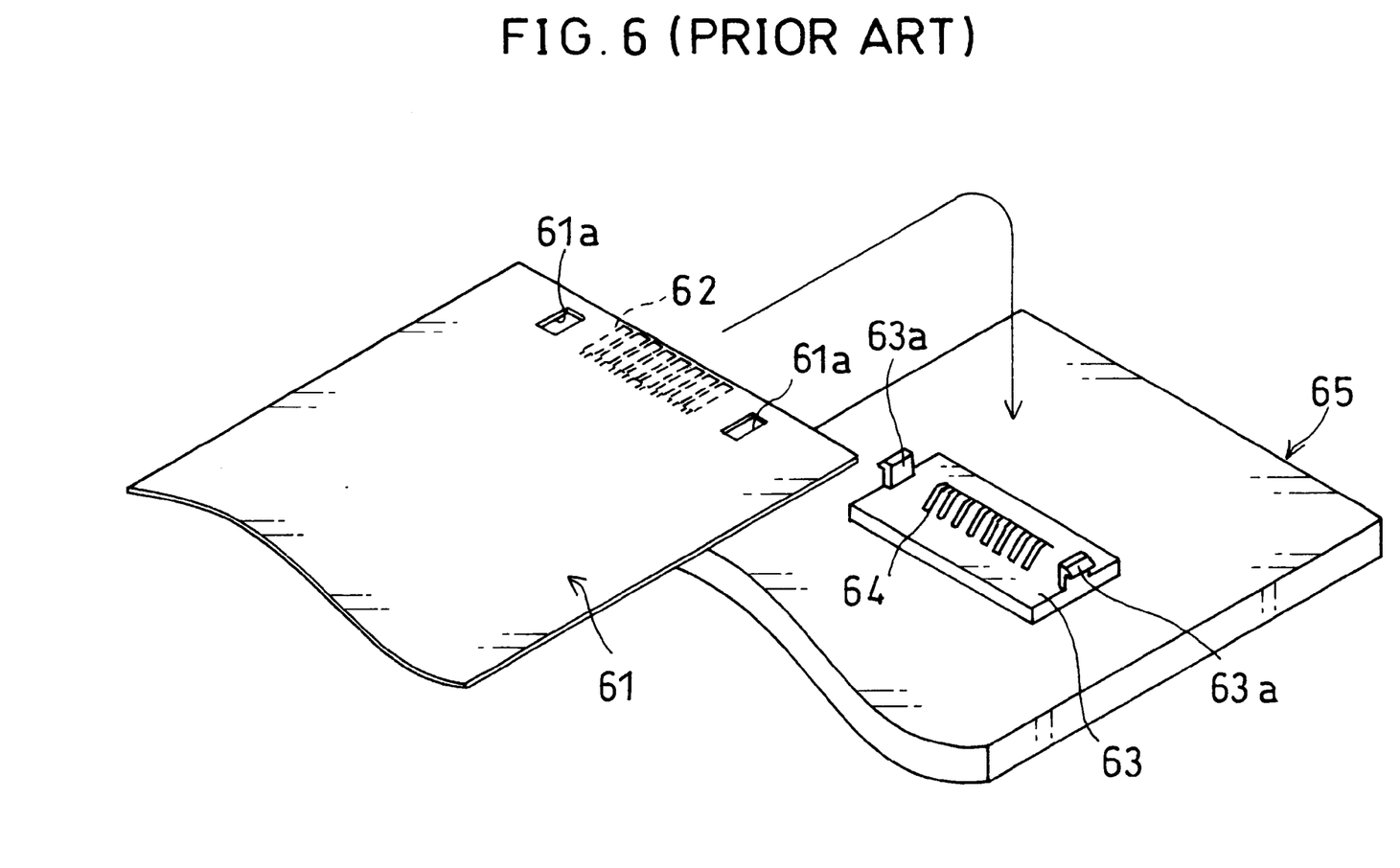
FIG. 6 is a perspective view showing another structure that connects a conventional flexible substrate to an external substrate.

(3) Japanese Laid-Open Patent Application No. 9-22760/1997 (Tokukaihei 9-22760; published on Jan. 21, 1997) discloses a structure in which signal input/output terminals 62 of a flexible substrate 61 contact a connector 63 with contact pins 64 on an external substrate 65 as shown in FIG. 6 to establish electrically conducting paths. The flexible substrate 61 is provided with engagement holes 61a with which engagement claws 63a of the connector 63 engage to secure the flexible substrate 61 onto the connector 63.

However, these methods entail following problems.

According to method (1), soldering is essential. In addition, prior to the soldering, the flexible substrate must be positioned precisely relative to the external substrate. In flexible substrates popularly used in recent years, the signal input/output terminals have so narrow intervals between them that the terminals makes a short circuit with an adjacent one even with a slight displacement in positioning. Therefore, extreme care is required in the positioning, which reduces operating efficiency. Besides, a solder and soldering iron need be prepared, as well as work space for the soldering operation. The flexible substrate must be removed to perform a maintenance operation and replace malfunctioning parts. In a worst case scenario, the external substrate, not to mention the flexible substrate, cannot be used again.

According to method (2), no soldering is necessary. Neither are preparations nor work space for it. The external substrate and the substrate can be used again. However, as shown in FIG. 5, the connector 55 must be mounted to the external substrate 54 in advance and a part of the external substrate 54 must be set aside in advance to attach the connector 55. In addition, typically, the connector 55 for use with flexible substrates requires the flexible substrate 51 to have a predetermined thickness on the back of the signal input/output terminals 52; a plate member 53 of a resin, for example, needs be attached to provide extra strength to it. Cost adds up due to additional labor and materials needed in positioning and combining operations to attach the plate member 53.

According to method (3), similarly to method (2), no soldering is necessary. Neither are preparations nor work space for it. The external substrate and the substrate can be used again. No plate member need be attached to provide extra strength to the flexible substrate 61. However, similarly to (2), the connector 63 with the contact pins 64 needs be mounted in advance to the external substrate 65 as shown in FIG. 6, and a part of the external substrate 65 must be set aside in advance to attach the connector 63. This entails expansion of the external substrate 65.

SUMMARY OF THE INVENTION

The present invention has a principal objective to offer terminal connecting devices for readily and securely connecting terminals of a flexible substrate to those of an external substrate, which allows for reduction in size of the external substrate by means of elimination of needs to use a connector and which can be manufactured at reduced cost.

A terminal connecting device for a flexible substrate in accordance with the present invention, in order to solve the problems, includes:

press means for connecting signal input/output terminals of a film-like flexible substrate provided with a wiring pattern to those of an external substrate by pressing the signal input/output terminals of the flexible substrate to those of the external substrate from a surface opposite to one where the signal input/output terminals of the flexible substrate are provided.

In the arrangement, the press means presses the signal input/output terminals of the flexible substrate from a surface opposite to one where those of the flexible substrate are provided, to establish connections between those of the flexible substrate and those of the external substrate.

This ensures establishment of electrically conducting paths between the flexible substrate and the external substrate.

For a fuller understanding of the nature and advantages of the invention, reference should be made to the ensuing detailed description taken in conjunction with the accompanying drawings.

DESCRIPTION OF THE EMBODIMENTS

Referring to FIG. 1 to FIG. 4, the following will describe an embodiment in accordance with the present invention, taking a liquid crystal display device as an example.

Figure 1:
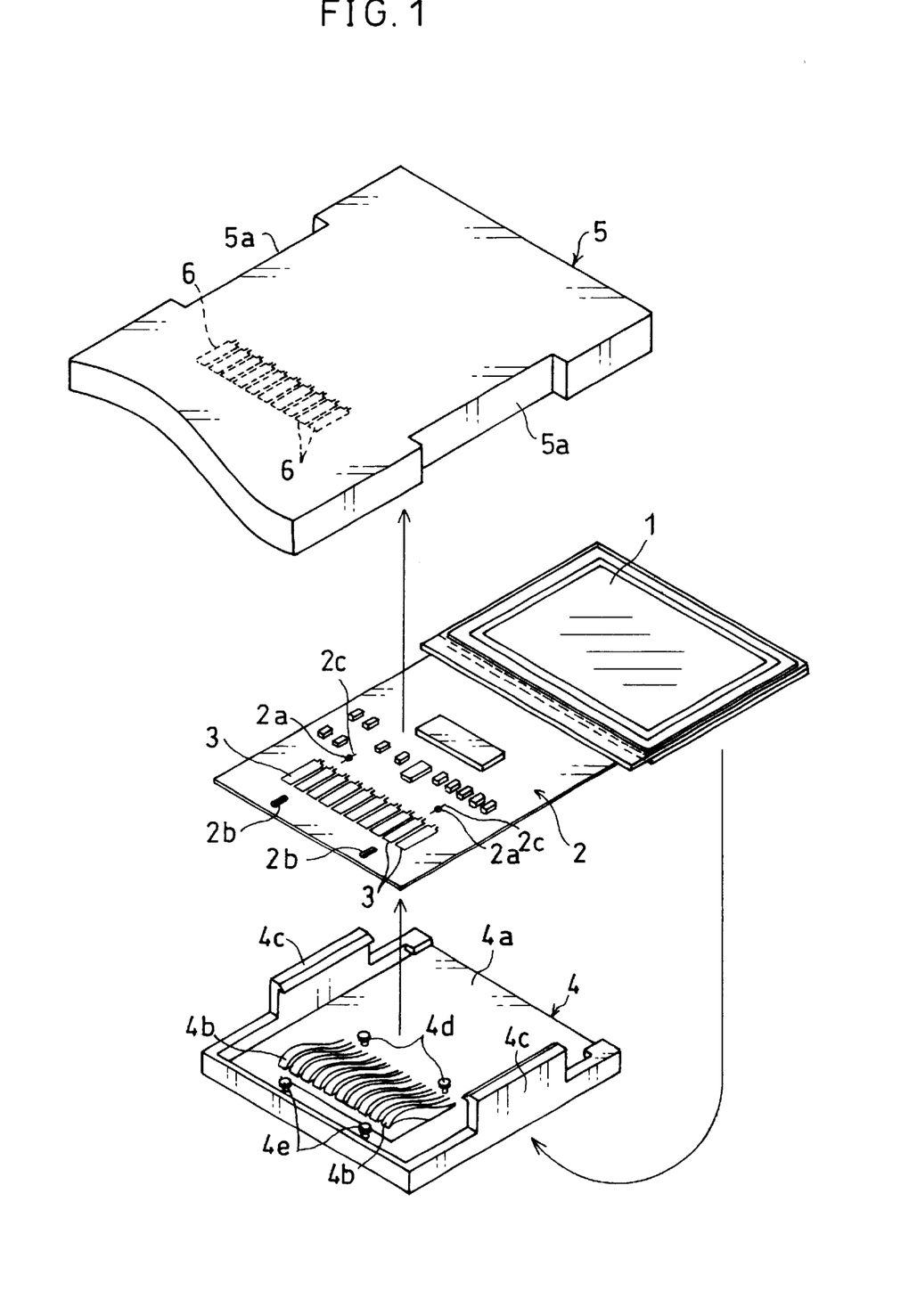
FIG. 1 is an exploded perspective view showing an arrangement of a terminal connecting device of an embodiment in accordance with the present invention and of an external substrate and a flexible substrate used in combination with the device.

FIG. 1 is a perspective view showing a terminal connecting device 4 which constitutes an embodiment in accordance with the present invention and associated components. A liquid crystal panel 1 is connected to a flexible substrate 2. On the flexible substrate 2 are there provided electronic components to drive a liquid crystal module.

The flexible substrate 2 is constructed in film form and provided with a wiring pattern (not shown). Signal input/output terminals 3 are provided side by side on the same surface of the flexible substrate 2 as are the foregoing electronic components. Holes 2a and 2b are provided surrounding the terminals 3.

The (first) holes 2a are located closer to the center of the flexible substrate 2 than the signal input/output terminals 3. The (second) holes 2b are located closer to an end of the flexible substrate 2 than the signal input/output terminals 3. Each hole 2a is formed with a smaller diameter than that of the head of a hold pin 4d (will be detailed later), but has a notch 2c where the head can be inserted.

Each hole 2b is formed in an elliptic shape with its major axis parallel to a longitudinal direction of a resin spring (press means, elastic body) 4b (will be detailed later) that is, a direction from the secured to free ends of the resin spring 4b when the flexible substrate 2 is attached to the terminal connecting device 4.

An external substrate 5 has a rectangular recess 5a on each side and is provided with signal input/output terminals 6 whose number matches that of the signal input/output terminals 3 of the flexible substrate 2.

The terminal connecting device 4 is made of resin and is provided with resin springs 4b near an end of a base section 4a as a support base along which no hold body sections (hold bodies) 4c is provided. Each resin spring 4b is positioned to contact the back of an associated signal input/output terminal 3 of the flexible substrate 2. The number of the resin springs 4b matches that of the signal input/output terminals 3 of the flexible substrate 2. The resin spring 4b is elastic, acting like a spring in response to application of a stress. The resin spring 4b has such a shape that, when a stress is applied to it from above, it is elastically distorted downward.

The base section 4a has along its sides the hold body sections 4c which stand substantially vertically to the base section 4a. Each hold body section 4c has substantially the same width as the recess 5a and is topped with a claw stricture which thrusts through the recess 5a and stops near the recess 5a on the upper surface of the external substrate 5. The claw structure has a slope so that its head slides smoothly in the recess 5a when engaging the hold body section 4c to the recess 5a.

In the vicinity of the resin springs 4b are there provided hold pins 4d as first hold members (first elongated members) and hold pins 4e as second hold members (second elongated members). Each hold pin 4d, 4e as an elongated member is constituted by an elongated portion and a head; the head has a larger diameter than the elongated portion and is, for example, spherical. The hold pins 4d are located at predetermined positions by the side of the resin springs 4b near their secured ends, whilst the hold pins 4e are located at predetermined positions by the side of the resin springs 4b near their free ends. The holes 2a, 2b and the hold pins 4d, 4e are provided for positioning purposes in attaching the flexible substrate 2 to the terminal connecting device 4.

Figure 2:
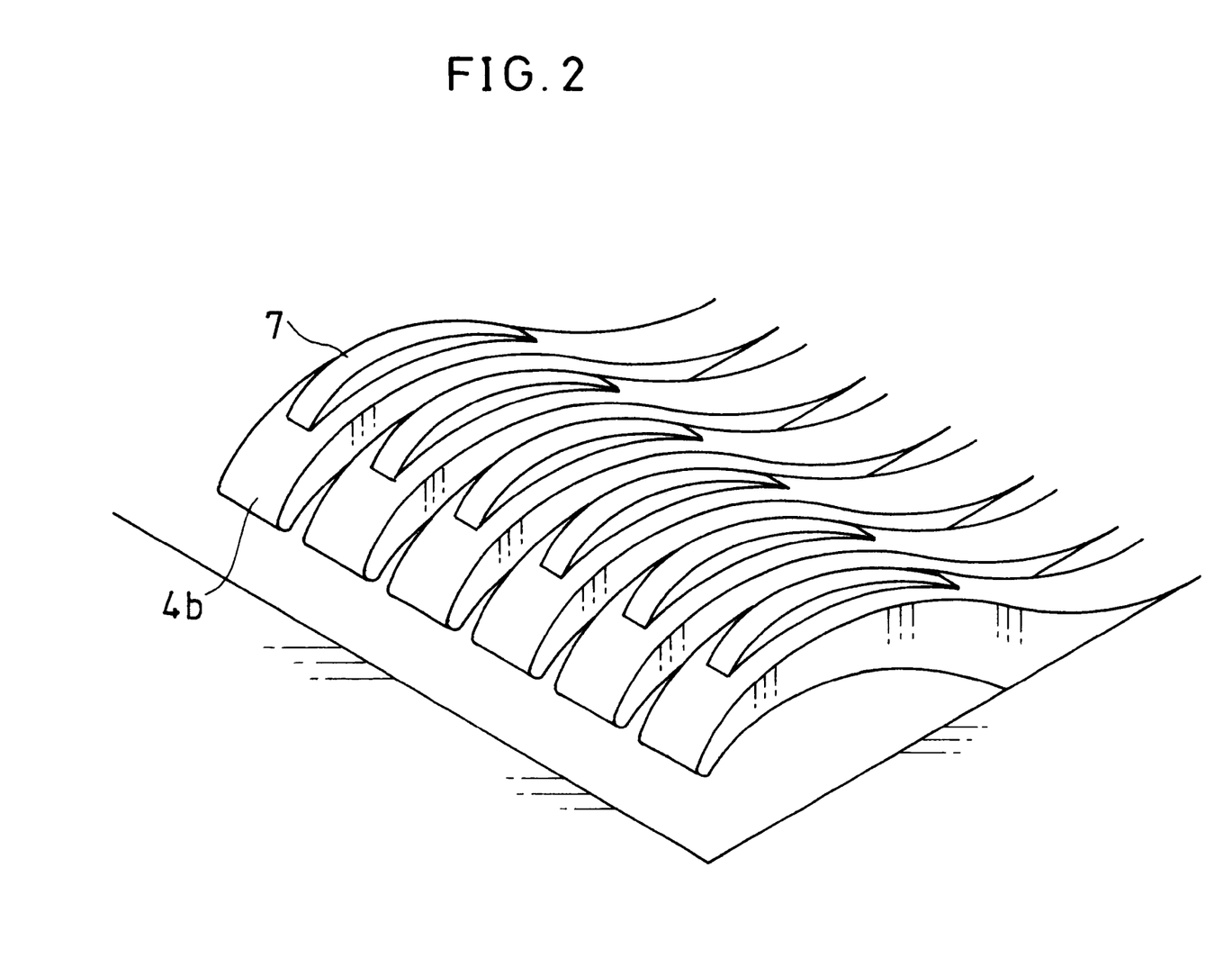
FIG. 2 is an enlarged perspective view showing an arrangement of resin springs of the terminal connecting device shown in FIG. 1.

Now, a description is given in detail about the resin springs 4b. As shown in FIG. 2, each resin spring 4b so arches that its shape is convex up. The resin spring 4b is secured at one of its ends (secured end) to the base section 4a near the center of the base section 4a and hovers at the other end (free end) above the base section 4a. The structure enables the resin spring 4b to practically stay in the arched shape. The flexible substrate 2 distorts in accordance with the shape of the resin springs 4b and pushes up the external substrate 5 vertically, efficiently transmitting stress from the resin springs 4b to the signal input/output terminals 6 of the external substrate 5.

The resin spring 4b has a thickness that is the largest at the secured end and tapers toward the free end and is provided on its upper surface with an arching press hump (hump) 7. As the area becomes smaller where the press humps 7 contact the flexible substrate 2, the flexible substrate 2 is pressed to the external substrate 5 with increasingly stronger force, and it is better ensured that electrically conducting paths are established between the signal input/output terminals 3 of the flexible substrate 2 and the signal input/output terminals 6 of the external substrate 5.

The flexible substrate 2 is attached to the terminal connecting device 4 as it is held in place in accordance with the shape of the resin springs 4b by the hold pins 4d, 4e as mentioned above. When attaching the flexible substrate 2, the head of the hold pin 4d expands the notch 2c of the hole 2a and thus enables the hold pin 4d to pass through the hole 2a. The head, once thrust, holds the hold pin 4d in place and does not allow it to slip off the hole 2a. The hold pin 4e can pass through the hole 2b with no notch, since the hole 2b is elliptic. The head of the hold pin 4e holds the flexible substrate 2 in place in the same manner as does the hold pin 4d.

Figure 3:
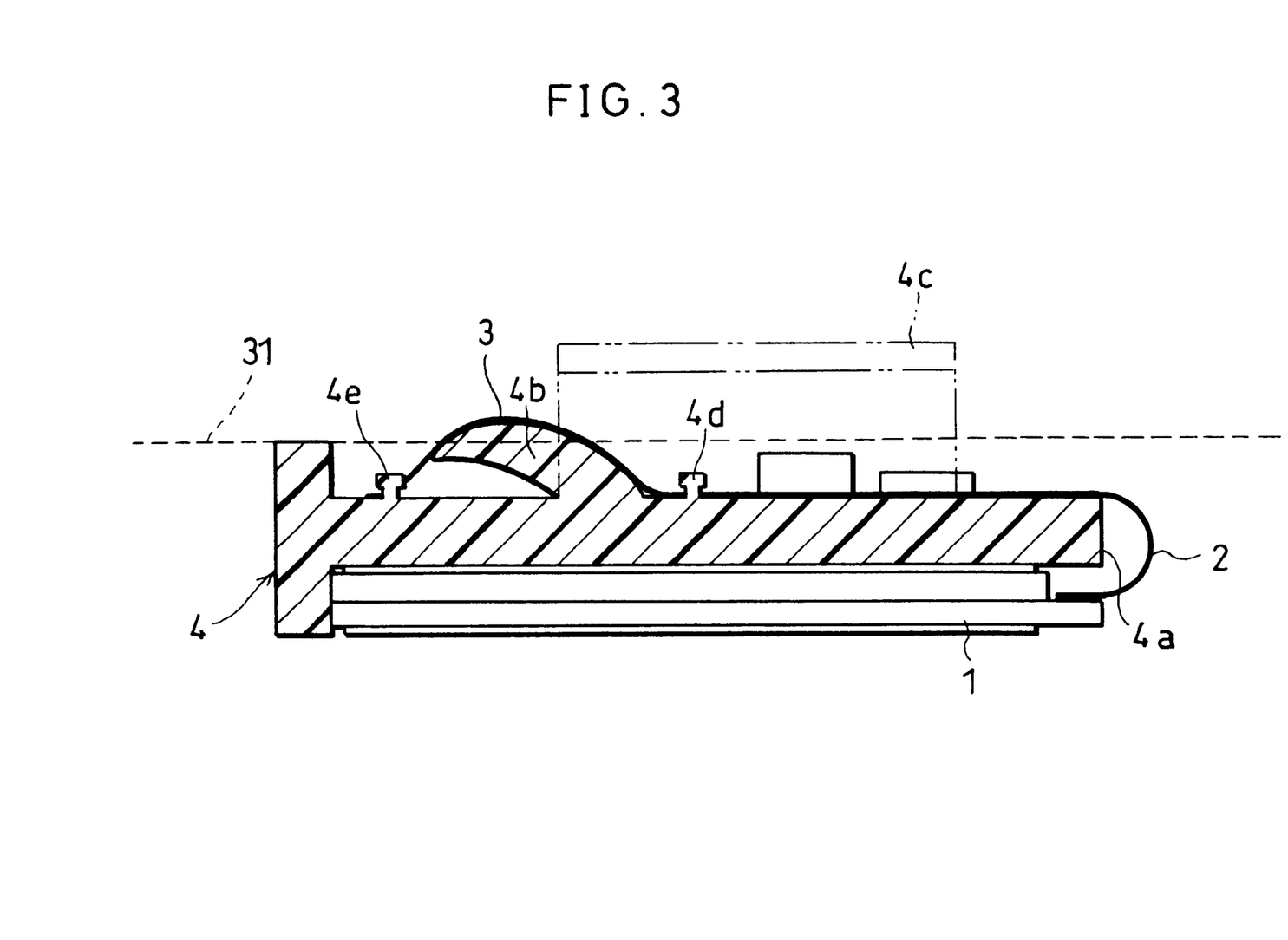
FIG. 3 is a cross-sectional view showing a flexible substrate being attached to the terminal connecting device shown in FIG. 1.

The liquid crystal panel 1 is turned over and placed beneath the lower surface of the terminal connecting device 4 as shown in FIG. 3. The flexible substrate 2 is pushed up at the signal input/output terminals 3 by the resin springs 4b. Under these conditions, the resin springs 4b thrust above the line 31 representing the surface of the external substrate 5 when the terminal connecting device 4 is attached to the external substrate 5.

Figure 4:
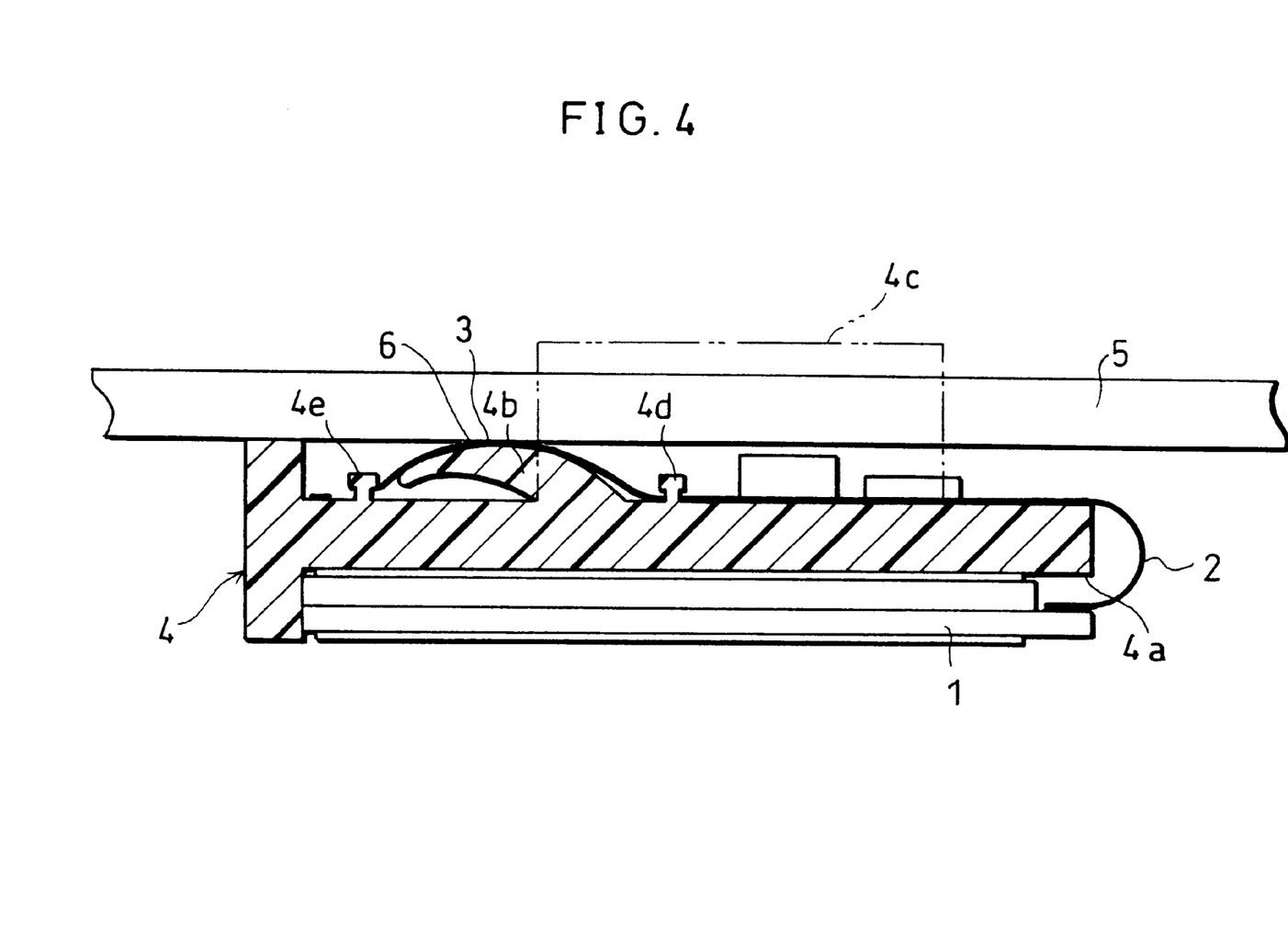
FIG. 4 is a cross-sectional view showing an external substrate being additionally attached to the combined components shown in FIG. 3.

The terminal connecting device 4 is attached to the external substrate 5 by the hold body sections 4c as shown in FIG. 4. Under these conditions, the resin springs 4b are pushed down by the external substrate 5 and elastically distorted. Due to a repulsive force arising from the elastic distortion of the resin springs 4b, the signal input/output terminals 3 of the flexible substrate 2 contact, and thus establish electrically conducting paths to, the signal input/output terminals 6 provided on the external substrate 5. This provides passage for electrical signals to and from the external substrate 5.

When attaching the terminal connecting device 4 to the external substrate 5, the resin springs 4b are pressed by the external substrate 5 and elastically distorted with their free ends moved toward the hold pins 4e. Since the holes 2b are elliptic, the holes 2b allow the edge of the flexible substrate 2 to move accordingly. In addition, the hold pins 4e do not slip off the holes 2b, which ensures that the flexible substrate 2 is pressed to the external substrate 5.

Further, the recesses 5a are formed in the external substrate 5 to help positioning. This makes the positioning of the terminal connecting device 4 easier and rarely allows the terminal connecting device 4 to be displaced due to vibration or shock.

Now, the following will describe an assembly process in reference to FIG. 1.

First, the hold pins 4d of the terminal connecting device 4 are inserted into the holes 2a of the substrate 2, and the hold pin 4e of the terminal connecting device 4 are inserted into the holes 2b of the flexible substrate 2.

Next, the flexible substrate 2 is folded to place the liquid crystal panel 1 beneath the lower surface of the terminal connecting device 4. The hold body sections 4c are then coupled to the recesses 5a to attach the terminal connecting device 4 to the external substrate 5. Thus, the signal input/output terminals 3 of the flexible substrate 2 are pressed to the signal input/output terminals 6 of the external substrate 5 by the resin springs 4b and the press humps 7. In this manner, in the assembly process, all the forces that the flexible substrate 2 receives are vertical.

When there is a need to replace a component, the members can be readily disassembled by removing the members in a reverse order to the assembly operation. The disassembly involves no complex operations and very unlikely damage any parts. As the terminal connecting device 4 is removed from the external substrate 5, the resin springs 4b returns to its original shape and therefore can be recycled. The flexible substrate 2, which is not soldered or inserted into a connector, is very unlikely damaged in the removal and can be recycled provided that it functions well.

As detailed in the above, the terminal connecting device 4 of the present embodiment is provided with resin springs 4b that presses the flexible substrate 2 on the back of the signal input/output terminals 3; therefore, no connector or the like for connecting the signal input/output terminals 3 need be provided on the external substrate 5. This allows for reduction in size of the external substrate 5. The hold pins 4d, 4e and the holes 2a, 2b holding the flexible substrate 2 to the terminal connecting device 4 prevents the flexible substrate 2 from hovering above the resin springs 4b. This provides protection to the flexible substrate 2 in, for example, loading or mounting it in a device, since there is no likelihood of it being caught.

The present embodiment was illustrated by means of the terminal connecting device 4 connecting the liquid crystal panel 1 to the flexible substrate 2 as an example. However, the terminal connecting device 4 may be used with other devices. The flexible substrate was a substrate with electronic components provided thereon; alternatively, the flexible substrate may be other kinds of substrates, including substrates with no electronic components provided thereon and tape carrier packages (TCP). The hold pins 4d, 4e and the holes 2a, 2b may be increased or decreased in number according to the dimensions of the flexible substrate 2 and the terminal connecting device 4. Further, all the resin springs 4b were arranged side by side in a single array on the base section 4a; alternatively, the resin springs 4b may be grouped in two arrays. When this is the case, the signal input/output terminals 3 of the flexible substrate 2 and the signal input/output terminals 6 of the external substrate 5 need be arranged according to the resin springs 4b.

As detailed in the foregoing, a terminal connecting device for a flexible substrate in accordance with the present invention connects signal input/output terminals of a film-like flexible substrate provided with a wiring pattern to those of an external substrate and includes:

press means for pressing the signal input/output terminals of the flexible substrate to those of the external substrate from a surface opposite to one where the signal input/output terminals of the flexible substrate are provided.

In the arrangement, the press means presses the signal input/output terminals of the flexible substrate from a surface opposite to one where those of the flexible substrate are provided, to establish connections between those of the flexible substrate and those of the external substrate; therefore, establishment of electrically conducting paths is ensured between the flexible substrate and the external substrate. There is no longer a need to provide connectors or the like for connecting these signal input/output terminals on the external substrate. This allows for reduction in size and weight of the external substrate.

Further, a terminal connecting device for a flexible substrate is preferably such that:

the press means is divided into more than one part whose number corresponds to the number of the signal input/output terminals of the external substrate and includes an elastic body acting as a spring.

In the arrangement, the elastic body acting as a spring is divided into more than one part whose number corresponds to the number of the signal input/output terminals of the substrate; therefore, each divided elastic body part presses an associated signal input/output terminals of the flexible substrate. The divided elastic body parts, when compared to a single elastic body, more certainly and efficiently apply pressure to individual signal input/output terminals.

Further, a terminal connecting device for a flexible substrate preferably further includes:

a support base for supporting the elastic body; and a hold body for holding the support base to the external substrate in such a manner that the support base can be freely attached to and detached from the external substrate.

In the arrangement, the support base of the elastic body is provided with a hold body for holding the support base to the external substrate in such a manner that the support base can be freely attached to and detached from the external substrate; therefore, the terminal connecting device for a flexible substrate can be connected to the external substrate, and at the same time, the signal input/output terminals of the flexible substrate can be connected to those of the external substrate.

This allows for facilitation of connecting the signal input/output terminals of the flexible substrate and of the external substrate.

Further, a terminal connecting device for a flexible substrate is preferably such that:

the elastic body has a free end that can swing freely and a secured end that is secured to the support base.

In the arrangement, the elastic body has a free end and a secured end; therefore, stress can be efficiently transmitted at the contacts of the signal input/output terminals of the external substrate and those of the flexible substrate from those of the elastic body to those of the external substrate. Pressure can be thus more efficiently applied to the flexible substrate.

A terminal connecting device for a flexible substrate is preferably such that:

the elastic body has a hump that contacts the flexible substrate.

In the arrangement, the elastic body acting as a spring has a hump for contacting the flexible substrate; thereby, the elastic body contacts the flexible substrate in a reduced area. The elastic body with a hump, when compared to one with no hump, can press the flexible substrate to the external substrate with stronger force, which better ensures establishment of connections between the signal input/output terminals.

Further, a terminal connecting device for a flexible substrate preferably further includes:

a first hold member for holding the flexible substrate to the support base at a predetermined place near the secured end; and a second hold member for holding the flexible substrate to the support base at a predetermined place near the free end.

In the arrangement, the flexible substrate is held to the support base by the first hold member near the secured end and by the second hold member near the free end; therefore, the flexible substrate can be prevented from hovering near the secured and free ends. This provides protection to the flexible substrate in, for example, loading or mounting it in a device, since there is no likelihood of it being caught. Further, the terminals likely make a short circuit with an adjacent one if the flexible substrate is displaced relative to a housing even by small amounts; however, since the flexible substrate is held at predetermined places, there is no longer a need for positioning, which improves operating efficiency.

A terminal connecting device for a flexible substrate is preferably such that:

the second hold member includes an elongated member that thrusts through a hole formed in the flexible substrate so that the flexible substrate is positioned with a longitudinal side thereof parallel to a direction from the secured end to the free end.

In the arrangement, the second hold member including an elongated member thrusts through a hole thus formed in the flexible substrate; therefore, a motion of the flexible substrate caused by distortion of the elastic body near the free end does not produce negative effects, which ensures the flexible substrate is held in place. This eliminates the need for positioning and improves operating efficiency.

A terminal connecting device for a flexible substrate is preferably such that:

the elastic body is formed as an integral part of a support base for supporting the elastic body.

In the arrangement, the elastic body is formed as an integral part of the support base; therefore, stress can be efficiently transmitted at the contacts of the signal input/output terminals of the external substrate and those of the flexible substrate. Further, no parts or materials, such as a welding material, are needed to couple the elastic body to the support base, which reduces cost for parts and materials.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A terminal connecting device for a flexible substrate, comprising:

press means for connecting signal input/output terminals of a film-like flexible substrate provided with a wiring pattern to those of an external substrate by pressing the signal input/output terminals of the flexible substrate to those of the external substrate from a surface opposite to one where the signal input/output terminals of the flexible substrate are provided, the press means including a free end that can swing freely and a secured end that is secured to a support base supporting the press means;

a first hold member for holding the flexible substrate to the support base at a predetermined place near the secured end; and a second hold member for holding the flexible substrate to the support base at a predetermined place near the free end, the second hold member including a first elongated member that thrusts through a first hole which is formed in the flexible substrate so as to be positioned with a longitudinal side thereof parallel to a direction from the secured end to the free end.

2. The terminal connecting device as defined in claim 1, wherein:

the press means includes an elastic body acting as a spring and is divided into more than one part whose number corresponds to the number of the signal input/output terminals of the external substrate.

3. The terminal connecting device as defined in claim 2, further comprising:

a support base for supporting the elastic body; and a hold body for holding the support base to the external substrate in such a manner that the support base can be freely attached to and detached from the external substrate.

4. The terminal connecting device as defined in claim 3, wherein:

the hold body has a slope surface at an end thereof.

5. The terminal connecting device as defined in claim 1, wherein:

the first hold member includes a second elongated member that thrusts through a second hole formed alongside a notch in the flexible substrate.

6. The terminal connecting device as defined in claim 5, wherein:

the second elongated member includes a cylindrical elongated portion and a head which has a larger diameter than the elongated portion.

7. The terminal connecting device as defined in claim 6, wherein:

the head has a larger diameter than the second hole.

8. The terminal connecting device as defined in claim 1, wherein:

the first elongated member includes a cylindrical elongated portion and a head which has a larger diameter than the elongated portion.

9. The terminal connecting device as defined in claim 2, wherein:

the elastic body has a hump that contacts the flexible substrate.

10. The terminal connecting device as defined in claim 2, wherein:

the elastic body is formed as an integral part of a support base for supporting the elastic body.

* * * * *